(12) United States Patent
Wu (10) Patent No.: US 6,781,186 B1
(45) Date of Patent: Aug. 24, 2004

(54) STACK-GATE FLASH CELL STRUCTURE HAVING A HIGH COUPLING RATIO AND ITS CONTACTLESS FLASH MEMORY ARRAYS

(75) Inventor: Ching-Yuan Wu, Hsinchu (TW)

(73) Assignee: Silicon-Based Technology Corp., Hsinchu (TW)

( * ) Notice: Subject to any disclaimer, the term of this patent is extended or adjusted under 35 U.S.C. 154(b) by 0 days.

(21) Appl. No.: 10/356,186

(22) Filed: Jan. 30, 2003

(51) Int. Cl.[7] ............................................. H01L 29/788
(52) U.S. Cl. ...................... 257/315; 257/315; 257/317
(58) Field of Search ................................ 257/315, 321, 257/900, 510, 316, 390, 622; 365/185.08

(56) References Cited

U.S. PATENT DOCUMENTS

| | | | | |
|---|---|---|---|---|
| 5,977,584 A | * | 11/1999 | Kim ............................ | 257/315 |
| 6,285,584 B1 | * | 9/2001 | Ahrens et al. .......... | 365/185.05 |
| 6,621,119 B1 | * | 9/2003 | Wu .............................. | 257/321 |

\* cited by examiner

Primary Examiner—David Nelms
Assistant Examiner—Thinh T Nguyen
(74) Attorney, Agent, or Firm—Pro-Techtor Inter-National Services (57) ABSTRACT

A stack-gate flash cell structure of the present invention comprises a gate region being formed between common-source/drain regions. The common-source/drain region comprises a common-source/drain diffusion region, an etched-back planarized silicon dioxide layer being formed over a portion of a tunneling dielectric layer, and a pair of extended floating-gate spacers being formed over side portions of the etched-back planarized silicon dioxide layer. The gate region comprises a major floating-gate being integrated with nearby two extended floating-gate spacers to form an integrated floating-gate. A word line together with an intergate dielectric layer being at least formed over the integrated floating-gate are simultaneously patterned and etched. A cell isolation region is formed outside of the word line and between the common-source/drain regions. The stack-gate flash cell structure is used to implement two contactless flash memory arrays.

20 Claims, 10 Drawing Sheets

STACK-GATE FLASH CELL STRUCTURE HAVING A HIGH COUPLING RATIO AND ITS CONTACTLESS FLASH MEMORY ARRAYS

FIELD OF THE INVENTION

The present invention relates to a stack-gate flash memory cell and its flash memory array and, more particularly, to a stack-gate flash cell structure having a high coupling ratio and its contactless flash memory arrays.

DESCRIPTION OF THE RELATED ART

A stack-gate flash memory cell is known to be a one-transistor cell, in which a gate length of the cell can be defined to be a minimum feature size (F) of technology used. As a consequence, the stack-gate flash memory cell is often used in a high-density flash memory system. The stack-gate flash memory cell can be configured into different array architectures such as NAND, NOR, and AND, based on the basic logic function.

For a NAND-type flash memory array, the stack-gate flash memory cell is connected in series with common-source/drain diffusion regions. In general, a unit cell size of a NAND-type flash memory array is small, but the read speed is slow due to the series resistance of the configuration. For a NOR-type flash memory array, the read speed is much faster, but the unit cell size is larger than that of a NAND-type flash memory array due to the bit-line contacts, and the punch-through effect becomes a major concern for further device scaling if the channel hot-electron injection (CHEI) is used as a programming method. For a AND-type flash memory array, the stack-gate flash memory cells are connected in parallel through the buried source/drain diffusion lines, the unit cell size is slightly larger than that of a NAND-type flash memory array but is smaller than of a NOR-type flash memory array, and the read speed is faster than that of a NAND-type flash memory array and is slower than that a NOR-type flash memory array.

Figure 1A:
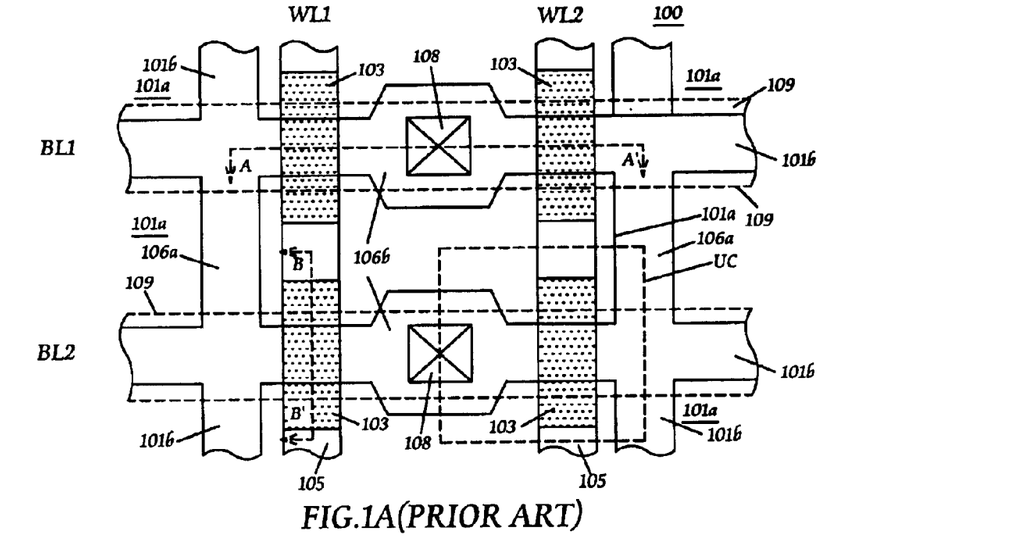
FIG. 1A shows a schematic top plan view of a NOR-type flash memory array.
Figure 1B:
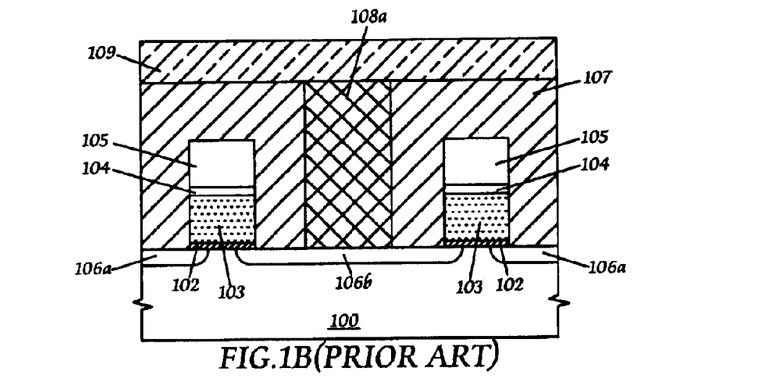
FIG. 1B shows a cross-sectional view along a A–A' line as indicated in FIG. 1A.
Figure 1C:
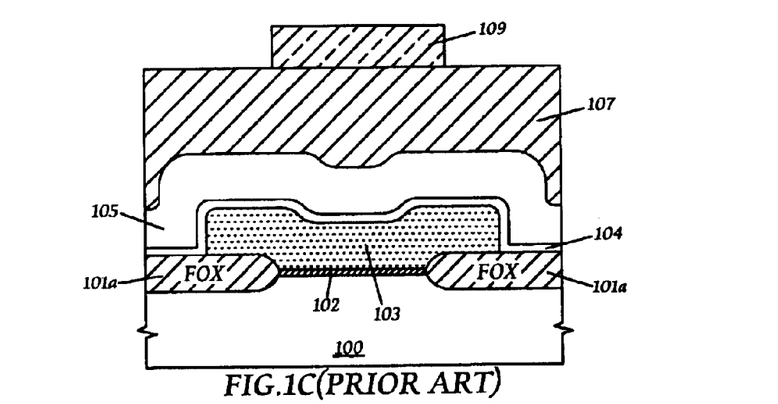
FIG. 1C shows a cross-sectional view along a B–B' line as indicated in FIG. 1A.

FIG. 1A shows a schematic top plan view of a conventional NOR-type flash memory array, in which a cross-sectional view along a A–A' line is shown in FIG. 1B and a cross-sectional view along a B–B' line is shown in FIG. 1C. As shown in FIG. 1A, an active region 101b is defined on a semiconductor substrate 100 by a first masking photoresist step with isolation regions 101a being formed outside of the active region 101b; the floating-gate layers 103 together with the control-gate layers 105 are simultaneously patterned by a third masking photoresist step, in which the width of the floating-gate layers 103 is patterned by a second masking photoresist step and the control-gate layer 105 is acted as a word line (WL1 or WL2); the active regions 101b outside of the control-gate layers 105 are implanted with a high dose of doping impurities in a self-aligned manner to form common-source diffusion regions 106a and common-drain diffusion regions 106b; an interlayer dielectric layer 107 is formed over a formed structure surface and is then planarized; the contact holes 108 are formed over the common-drain diffusion regions 106b by a fourth masking photoresist step; a tungsten plug being lined with a barrier metal layer 108a is formed to fill each of the contact holes 108 and is planarized; and the metal layers 109 being patterned by a fifth masking photoresist step are formed over the tungsten plugs 108a to act as the bit lines (BL1 and BL2). It is clearly seen that a NOR-type flash memory array shown in FIG. 1A needs at least five masking photoresist steps and a unit cell (UC) size as indicated by a dash square is at least $9F^2$.

FIG. 1B shows a cross-sectional view along a A–A' line shown in FIG. 1A, in which two stack-gate structures are formed on a semiconductor substrate 100. Each of the stack-gate structures comprises a control-gate layer 105 over an intergate dielectric layer 104 being formed over a floating-gate layer 103; a tunneling dielectric layer 102 being formed under the floating-gate layer 103 and on the semiconductor substrate 100; and a common-source diffusion region 106a and a common-drain diffusion region 106b being formed in surface portions of the semiconductor substrate 100 in a self-aligned manner by using the stack-gate structures as implantation masks. A contact hole 108 being filled with a tungsten plug 108a is formed over a surface portion of the common-drain diffusion region 106b, and a metal layer 109 acting as a bit line is formed over the interlayer dielectric layer 107 and is connected to the tungsten plug 108a. It is clearly seen from FIG. 1B that the fourth masking photoresist step is required to form the contact hole 108 between two stack-gate structures and misalignment of the contact hole 108 would result in asymmetric parasitic drain resistance for nearby stack-gate structures.

FIG. 1C shows a cross-sectional view along a B–B' line shown in FIG. 1A, in which a floating-gate layer 103 is formed over a tunneling dielectric layer 102 and two field-oxide (FOX) layers 110a to increase the coupling ratio; an intergate dielectric layer 104 is formed over the floating-gate layer 103 and portions of the field-oxide layers 101a; a control-gate layer 105 is formed over the intergate dielectric layer 104; an interlayer dielectric layer 107 is formed over the control-gate layer 107; and a metal layer 109 is formed over a surface portion of the interlayer dielectric layer 107 and is aligned above a middle portion of the tunneling dielectric layer 102. It is clearly seen from FIG. 1C that the second masking photoresist step is required to pattern the width of the floating-gate layer 103 and misalignment between the floating-gate layer 103 with respect to the tunneling dielectric layer 102 in the active region 101b would occur and will result in asymmetric field distribution near two edges during programming and erasing.

It is, therefore, a major objective of the present invention to offer a stack-gate flash cell structure with an integrated floating-gate being formed along a channel-length direction to largely increase the coupling ratio of a cell.

It is another objective of the present invention to offer a parallel common-source/drain diffusion bit-lines array being fabricated with less masking photoresist steps.

It is a further objective of the present invention to offer a parallel common-source/drain diffusion bit-lines array having a unit cell size of $4F^2$.

Other objectives and advantages of the present invention will be more apparent in a later description.

SUMMARY OF THE INVENTION

The present invention discloses a stack-gate flash cell structure and its contactless flash memory arrays. The stack-gate flash cell structure comprises a gate region being formed between common-source/drain regions, wherein the gate region being defined by a first masking photoresist step is formed on a semiconductor substrate of a first conductivity type. Each of the common-source/drain regions comprises a common-source/drain diffusion region being formed in a surface portion of the semiconductor substrate, an etched-back planarized silicon dioxide layer over a first portion of a tunneling dielectric layer being formed on the common-source/drain diffusion region, and a pair of extended floating-gate spacers being formed over side portions of the etched-back planarized silicon dioxide layer in each of the common-source/drain regions. The gate region comprises a major floating-gate being formed over a second portion of the tunneling dielectric layer and integrated with nearby two extended floating-gate spacers to form an integrated floating-gate, wherein an implant region of the first conductivity type comprising a shallow implant region for threshold-voltage adjustment and a deep implant region for forming a punch-through stop can be formed in a middle surface portion of the semiconductor substrate in the gate region. A word line together with an intergate dielectric layer is formed over the integrated floating-gate and the etched-back planarized silicon dioxide layer between the pair of extended floating-gate spacers in each of the common-source/drain regions, wherein the word line, the intergate dielectric layer, and the integrated floating-gate are simultaneously patterned and etched by a second masking photoresist step. A cell isolation region comprising an isolation implant region of the first conductivity type or a shallow trench isolation region being formed in a surface portion of the semiconductor substrate outside of the word line and between the common-source/drain regions.

The contactless flash memory array of the present invention comprises a plurality of gate regions being defined by a first masking photoresist step, wherein each of the plurality of gate regions is formed over a semiconductor substrate of a first conductivity type between common-source/drain regions. Each of the common-source/drain regions comprises a common-source/drain diffusion region being formed in a surface portion of the semiconductor substrate to act as a buried diffusion bit line, an etched-back planarized silicon dioxide layer over a first portion of a tunneling dielectric layer being formed over the common-source/drain diffusion region, and a plurality of paired extended floating-gate spacers being formed over side portions of the etched-back planarized silicon dioxide layer. Each of the plurality of gate regions comprises a plurality of major floating-gates being formed over a second portion of the tunneling dielectric layer and integrated with nearby extended floating-gate spacers to form a plurality of integrated floating-gates, wherein an implant region of the first conductivity type comprising a shallow implant region for threshold-voltage adjustment and a deep implant region for forming a punch-through stop can be formed in a middle surface portion of the semiconductor substrate under each of the plurality of major floating-gates. A plurality of word lines together with a plurality of intergate dielectric layers are formed over the plurality of integrated floating-gates and the etched-back planarized silicon dioxide layers between the plurality of paired extended floating-gate spacers in each of the common-source/drain regions, wherein the plurality of word lines, the plurality of intergate dielectric layers, and the plurality of integrated floating-gates are simultaneously patterned and etched by a second masking photoresist step. A plurality of cell isolation regions comprising a plurality of isolation implant regions or a plurality of shallow trench isolation regions are formed in surface portions of the semiconductor substrate outside of the plurality of word lines and between the common-source/drain regions.

BRIEF DESCRIPTION OF THE DRAWINGS

FIG. 1A through FIG. 1C show schematic diagrams of a prior art, in which

FIG. 3A through FIG. 3E show schematic diagrams of the first-type contactless common-source/drain diffusion bit-lines flash memory array of the present invention, in which

FIG. 5A through FIG. 5F show schematic diagrams of the second-type contactless common-source/drain diffusion bit-lines flash memory array of the present invention, in which

DETAILED DESCRIPTION OF THE PREFERRED EMBODIMENTS

Referring now to FIG. 2A through FIG. 2G, there are shown process steps and their cross-sectional views for forming a first-type stack-gate flash cell structure and its first-type contactless common-source/drain diffusion bit-lines flash memory array of the present invention.

Figure 2A:
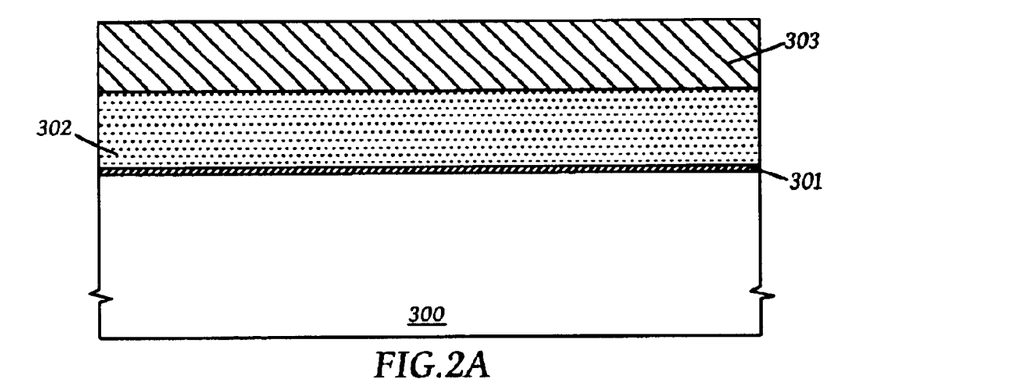
FIG. 2A through FIG. 2G show process steps and their cross-sectional views for forming a first-type stack-gate flash cell structure and its first-type contactless common-source/drain diffusion bit-lines flash memory array of the present invention.

FIG. 2A shows that a tunneling dielectric layer 301 is formed on a semiconductor substrate 300 of a first conductivity type; a first conductive layer 302 is then formed over the tunneling dielectric layer 301; and a masking dielectric layer 303 is formed over the first conductive layer 302. The tunneling dielectric layer 301 is preferably a thermal oxide layer or a nitrided thermal oxide layer and its thickness is preferably between 70 Angstroms and 120 Angstroms. The first conductive layer 302 is preferably made of doped polycrystalline silicon or doped amorphous silicon as deposited by low-pressure chemical vapor deposition (LPCVD) technique and its thickness is preferably between 1000 Angstroms and 3000 Angstroms. The masking dielectric layer 303 is preferably made of silicon nitride as deposited by LPCVD and its thickness is preferably between 1000 Angstroms and 3000 Angstroms.

Figure 2B:
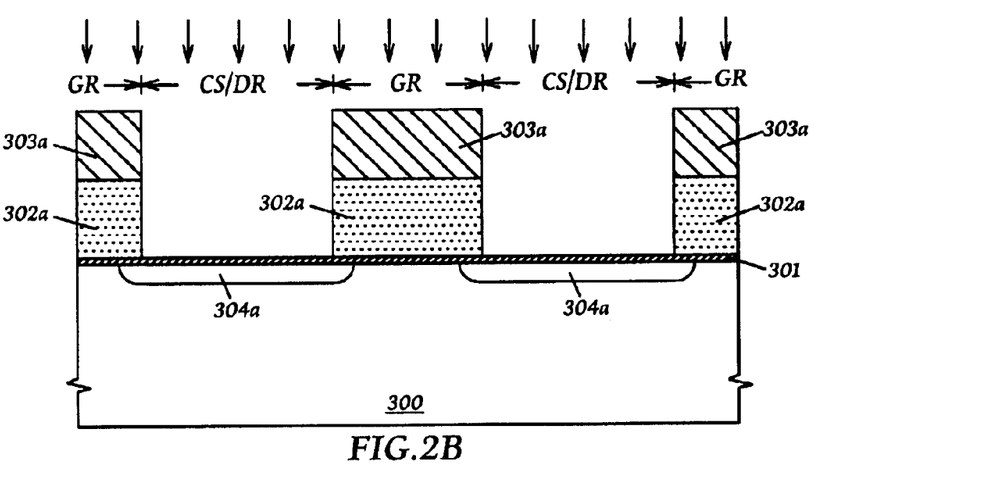

FIG. 2B shows that a structure shown in FIG. 2A is patterned by a first masking photoresist (PR1) step (not shown) to define a plurality of gate regions (GR); the masking dielectric layer 303 and the first conductive layer 302 in each of common-source/drain regions (CS/DR) are sequentially removed by anisotropic dry etching; and subsequently, common-source/drain diffusion regions 304a are formed by implanting doping impurities across the tunneling dielectric layer 301 into the semiconductor substrate 300 in a self-aligned manner. There are several doping structures for the common-source/drain diffusion regions 304a: the common-source/drain diffusion region can be a heavily-doped diffusion region of a second conductivity type or a shallow heavily-doped diffusion region of a second conductivity type being formed within a lightly-doped diffusion region of the second conductivity type; the common-source diffusion region can be a shallow heavily-doped diffusion region of a second conductivity type being formed within a lightly-doped diffusion region of the second conductivity type and the common-drain diffusion region can be a shallow heavily-doped diffusion region of the second conductivity type or a shallow heavily-doped diffusion region of the second conductivity type being formed within a moderately-doped diffusion region of the first conductivity type. It should be emphasized that different doping types or structures in the common-source diffusion regions and the common-drain diffusion regions need at least an additional masking photoresist step.

Figure 2C:
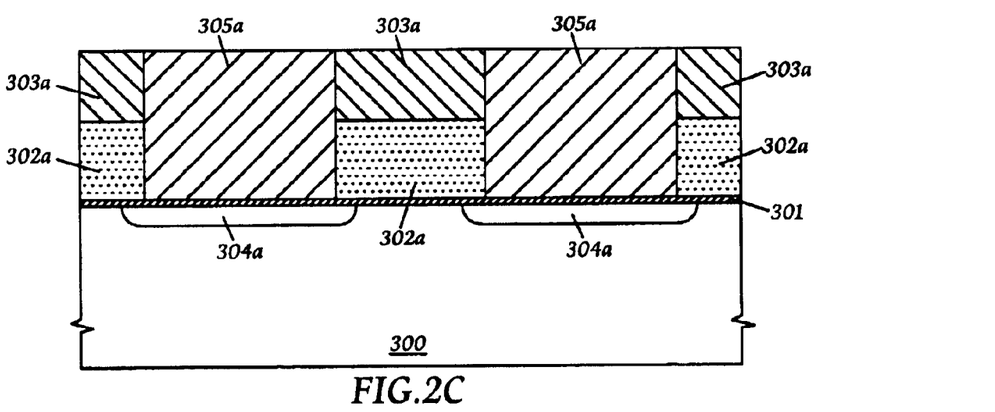

FIG. 2C shows that a planarized silicon dioxide layer 305a is used to fill a gap in each of the common-source/drain regions (CS/DR). The planarized silicon dioxide layer 305a is preferably deposited by LPCVD, high-density plasma (HDP) CVD, or plasma-enhanced (PE) CVD and is formed by first depositing a thick silicon dioxide layer 30 to fill a gap in each of the common-source/drain regions (CS/DR) and then planarizing the deposited thick silicon dioxide layer 30 by using chemical-mechanical polishing (CMP) with the patterned masking dielectric layer 303a as a polishing stop. It should be noted that the tunneling dielectric layer 301 in each of the common-source/drain regions (CS/DR) can be removed before forming the planarized silicon dioxide layers 305a.

Figure 2D:
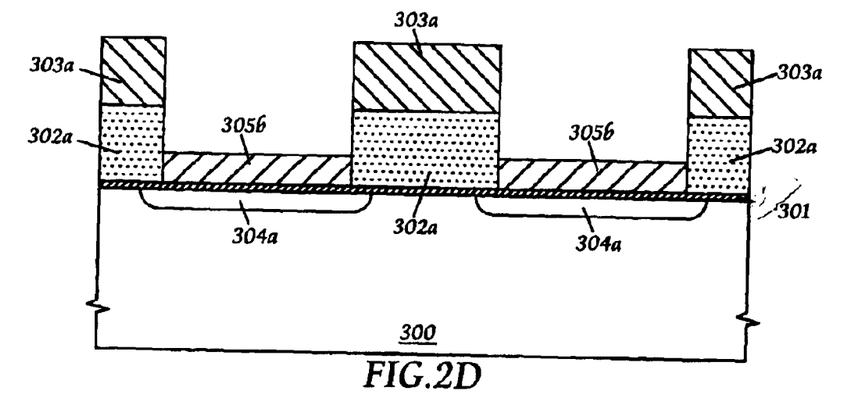

FIG. 2D shows that the planarized silicon dioxide layers 305a are etched back to have a thickness between 500 Angstroms and 1000 Angstroms to form etched-back planarized silicon dioxide layers 305b.

Figure 2E:
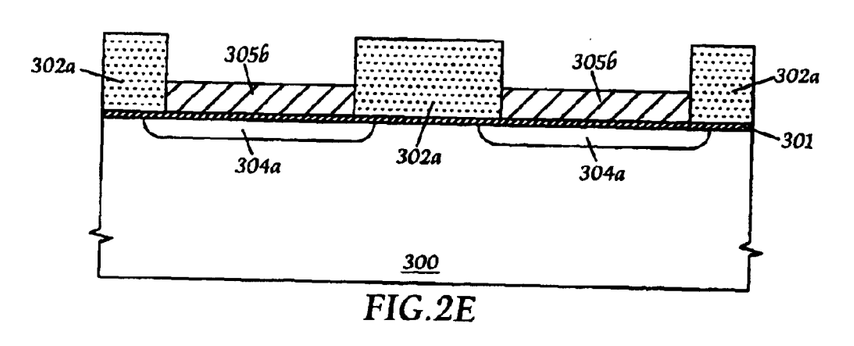

FIG. 2E shows that the patterned masking dielectric layers 303a are selectively removed by using hot phosphoric acid or anisotropic dry etching.

Figure 2F:
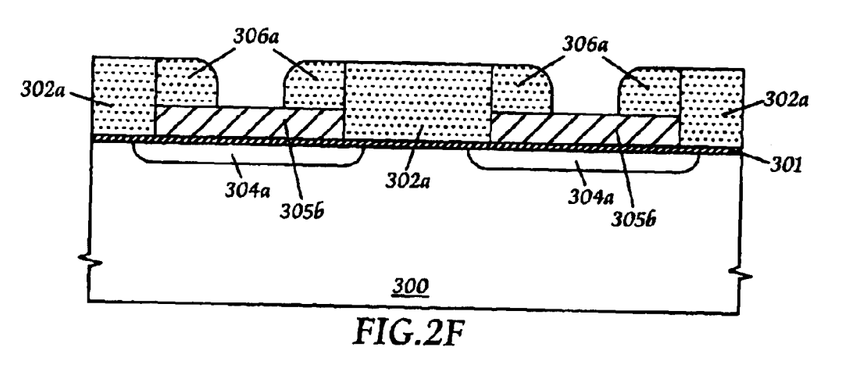

FIG. 2F shows that a pair of sidewall conductive spacers 306a are formed over sidewalls of nearby patterned first conductive layer 302a in each of the common-source/drain regions (CS/DR). The pair of sidewall conductive spacers 306a are preferably made of doped polycrystalline silicon or doped amorphous silicon as deposited by LPCVD and are formed by first depositing a second conductive layer 306 and then etching back a thickness of the deposited second conductive layer 306. It should be noted that the spacer width of the pair of sidewall conductive spacers 306a is mainly controlled by a thickness of the deposited second conductive layer 306.

Figure 2G:
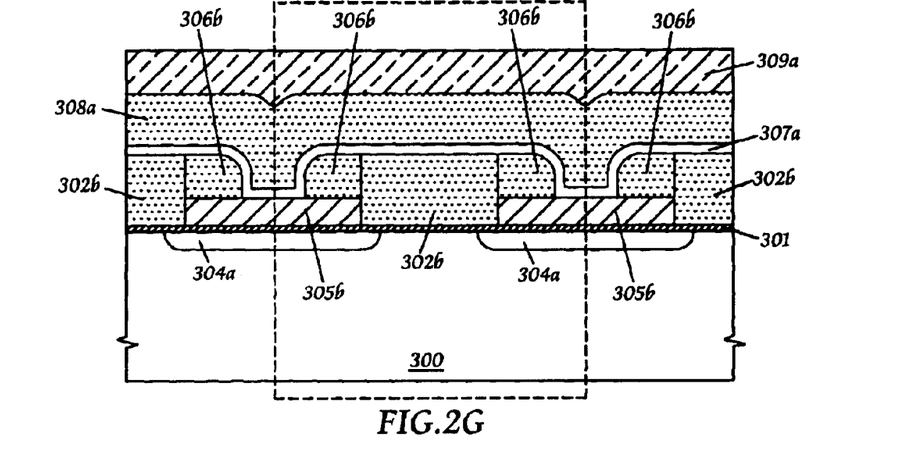

FIG. 2G shows an intergate dielectric layer 307 is formed over a structure surface shown in FIG. 2F; a third conductive layer 308 is then formed over the intergate dielectric layer 307; a metal layer 309 is formed over the third conductive layer 308; and subsequently, the metal layer 309, the third conductive layer 308, the intergate dielectric layer 307, the pair of sidewall conductive spacers 306a, and the patterned first conductive layers 302a are simultaneously patterned by a second masking photoresist (PR2) step (not shown) to form a plurality of word lines 309a/308a over a plurality of intergate dielectric layers 307a being formed over a plurality of integrated floating-gates 302b/306b, wherein the plurality of word lines 309a/308a are formed transversely to the common-source/drain diffusion regions 304a. It should be noted that a plurality of cell isolation regions 310a (not shown) are formed in surface portions of the semiconductor substrate 300 outside of the plurality of word lines 309a/308a and between nearby common-source/drain regions (CS/DR). Each of the plurality of cell isolation regions comprises an isolation implant region of the first conductive type or a shallow trench isolation (STI) region. The intergate dielectric layer 307 is preferably an oxide-nitride-oxide (ONO) layer and its equivalent oxide thickness is preferably between 80 Angstroms and 150 Angstroms. The third conductive layer 308 is preferably made of doped polycrystalline silicon or doped amorphous silicon as deposited by LPCVD and its thickness is preferably between 1500 Angstroms and 2500 Angstroms. The metal layer 309 is preferably a copper (Cu) or aluminum (Al) layer being formed over a barrier metal layer such as a titanium nitride (TiN) or tantalum nitride (TaN) layer. It should be noted that the metal layer 309 can be a tungsten (W) layer over a barrier metal layer or a tungsten disilicide ($WSi_2$) layer. It is clearly seen from FIG. 2G that the integrated floating-gate 302b/306b comprising a major floating-gate 302b and two extended floating-gate spacers 306b may largely increase the coupling ratio of a stack-gate flash cell as indicated by a dash square and two masking photoresist steps are required to form a first-type contactless parallel common-source/drain diffusion bit-lines array of the present invention.

Figure 3A:
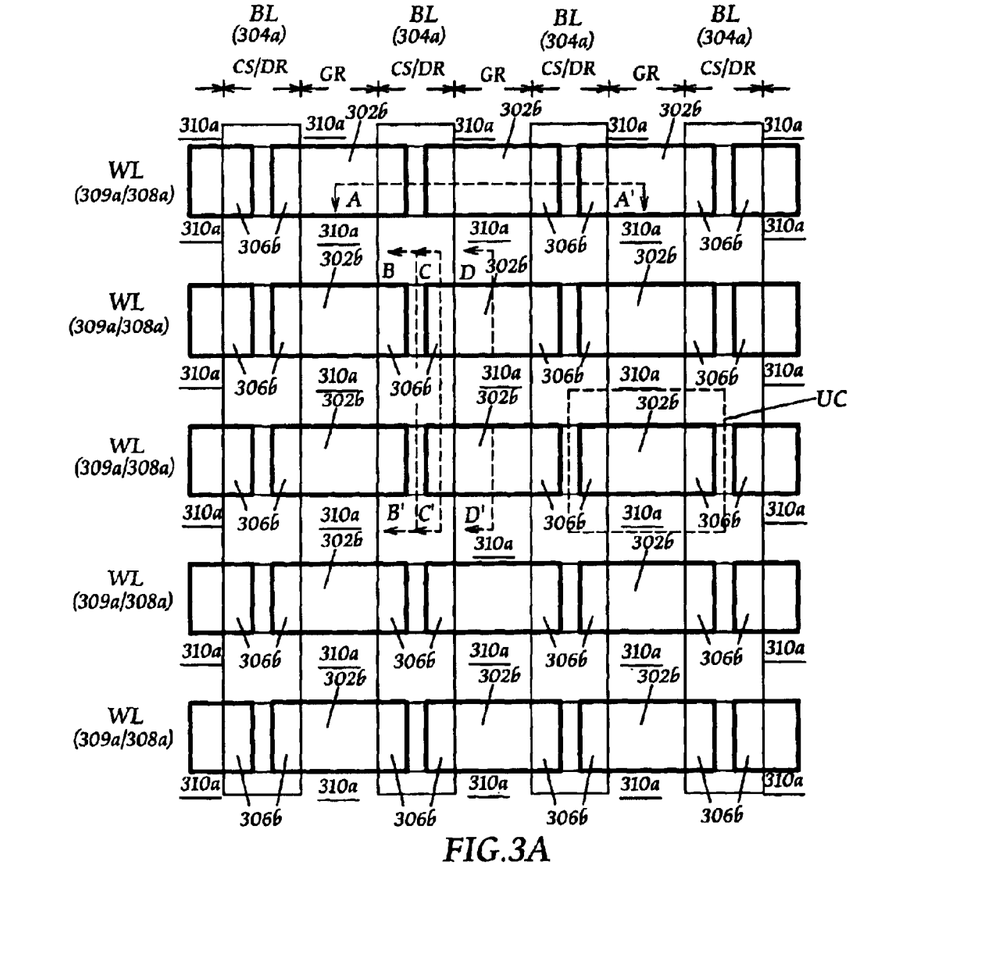
FIG. 3A shows a schematic top plan view.

Referring now to FIG. 3A, there is shown a top plan view of the first type stack-gate flash cell structure and its first-type contactless parallel common-source/drain diffusion bit-lines array of the present invention, in which a cross-sectional view along a A–A' line is shown in FIG. 2G. As shown in FIG. 3A, a plurality of gate regions (GR) are defined alternately, wherein each of the plurality of gate regions (GR) is formed between common-source/drain regions (CS/DR); a plurality of common-source/drain diffusion regions 304a being formed in the common-source/drain regions (CS/DR) are acted as a plurality of buried diffusion bit lines (BL's); a plurality of word lines (WL's) 309a/308a are defined to be perpendicular to the plurality of buried diffusion bit lines (BL's) and are formed above the integrated floating-gates 302b/306b; and a plurality of cell isolation regions 310a are formed in surface portions of the semiconductor substrate 300 outside of the plurality of word lines (WL's) 309a/308a and between nearby common-source/drain regions (CS/DR). A unit cell (UC) as indicated by a dash square can be made to be equal to $4F^2$ if the width of the cell isolation region 310a and the width of the word line 309a/308a are defined to be a minimum feature size (F).

Figure 3B:
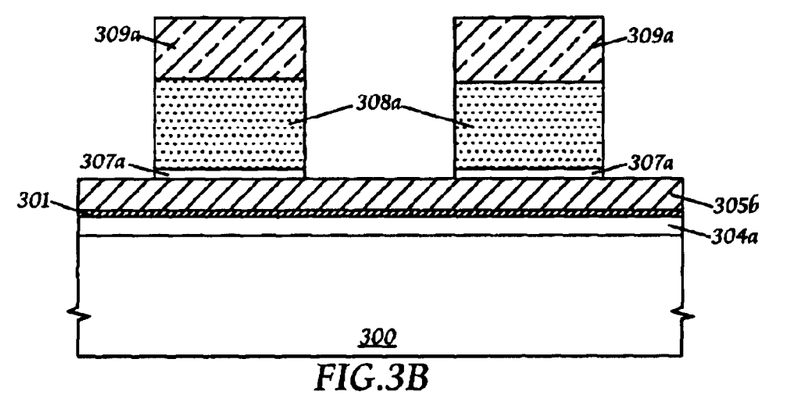
FIG. 3B shows a cross-sectional view along a B–B' line as indicated in FIG. 3A.

FIG. 3B shows a cross-sectional view along a B–B' line as indicated in FIG. 3A, wherein an etched-back planarized silicon dioxide layer 305b over a tunneling dielectric layer 301 is formed over a common-source/drain diffusion region 304a; a plurality of word lines 309a/308a over a plurality of intergate dielectric layers 307a are simultaneously patterned and etched by a second masking photoresist step.

Figure 3C:
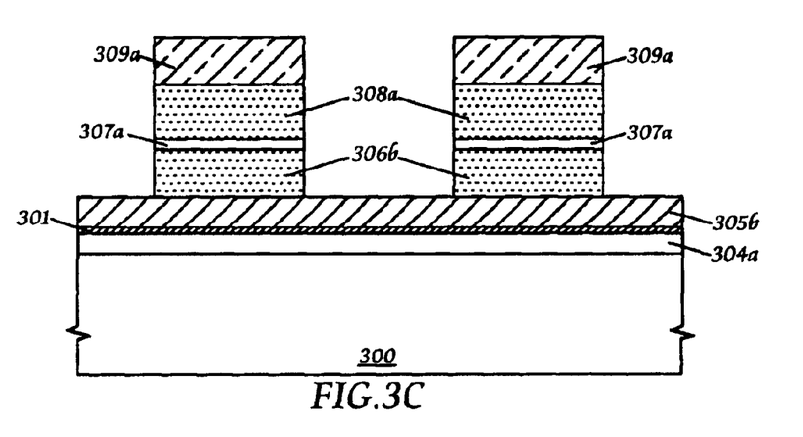
FIG. 3C shows a cross-sectional view along a C–C' line as indicated in FIG. 3A.

FIG. 3C shows a cross-sectional view along a C–C' line as indicated in FIG. 3A, wherein the plurality of word lines 309a/308a, the plurality of intergate dielectric layers 307a, and the plurality of extended floating-gate spacers 306b are simultaneously patterned and etched by the second masking photoresist step; and the etched-back planarized silicon dioxide layer 305b over the tunneling dielectric layer 301 are formed over each of the common-source/drain diffusion regions 304a.

Figure 3D:
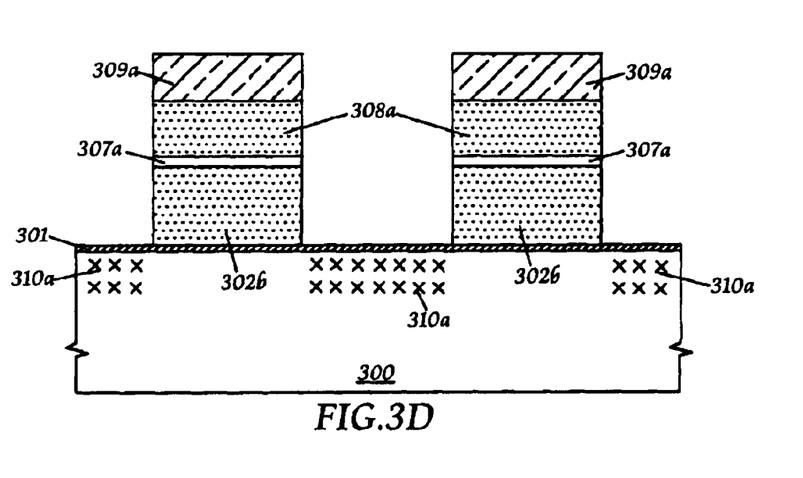
FIG. 3D shows a cross-sectional view along a D–D' line as indicated in FIG. 3A.

FIG. 3D shows a cross-sectional view along a D–D' line as indicated in FIG. 3A, wherein the plurality of word lines 309a/308a, the plurality of intergate dielectric layers 307a, and the plurality of major floating-gates 302b are simultaneously patterned and etched by the second masking photoresist step and the isolation implant region 310a is formed in a surface portion of the semiconductor substrate 300 between nearby word lines 309a/308a. It should be noted that the tunneling dielectric layer 301 between nearby word lines 309a/308a can be removed and the semiconductor substrate 300 between nearby word lines 309a/308a can be anisotropically etched to form a shallow trench.

Figure 3E:
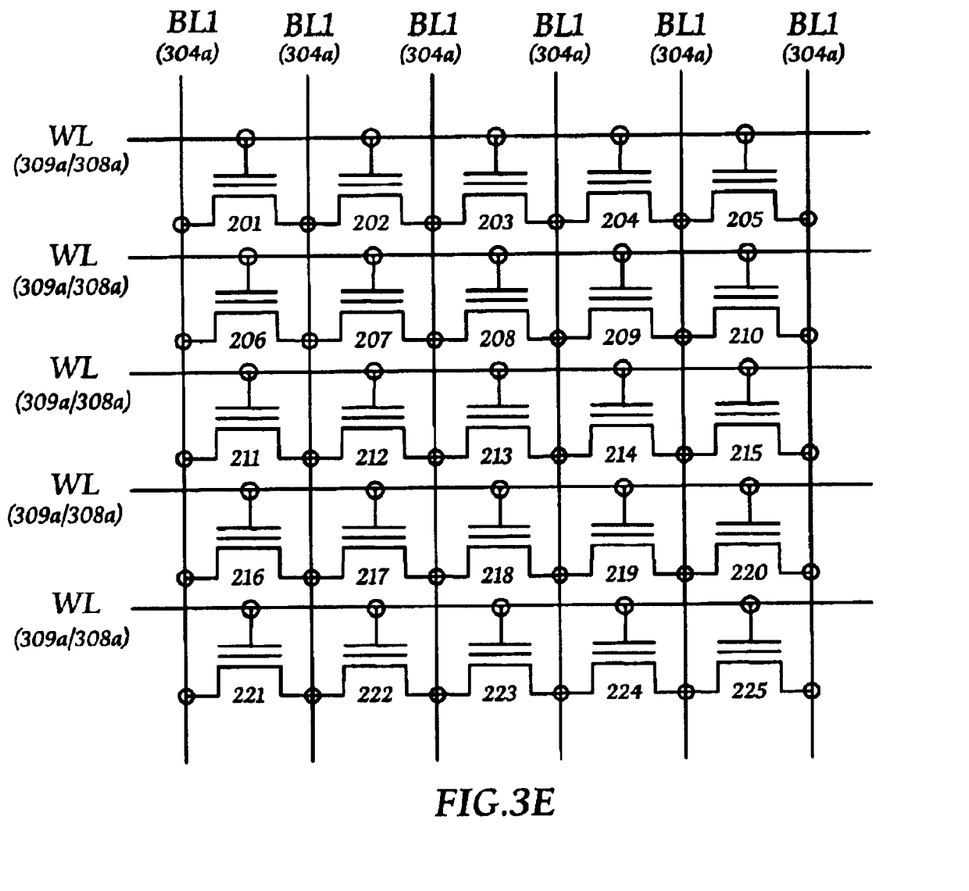
FIG. 3E shows a schematic circuit representation.

FIG. 3E shows a schematic circuit representation of the first-type contactless parallel common-source/drain bit-lines array, in which a plurality of first-type stack-gate flash cell structures are formed between the common-source/drain diffusion regions 304a being acted as a plurality of buried diffusion bit-lines (BL's) and the plurality of word lines (WL's) 309a/308a are formed transversely to the plurality of buried diffusion bit lines (BL's).

Referring now to FIG. 4A through FIG. 4D, there are shown simplified process steps after FIG. 2C and their cross-sectional views for forming a second-type stack-gate flash cell structure and its second-type contactless parallel common-source/drain diffusion bit-lines flash memory array.

Figure 4A:
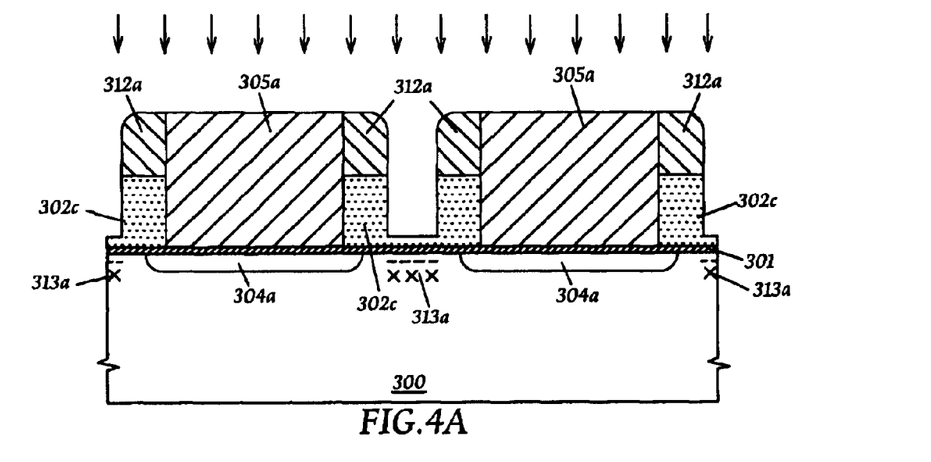
FIG. 4A through FIG. 4D show simplified process steps after FIG. 2C and their cross-sectional views for forming a second-type stack-gate flash cell structure and its second-type contactless common-source/drain diffusion bit-lines flash memory array of the present invention.

FIG. 4A shows that the patterned masking dielectric layers 303a shown in FIG. 2C are selectively removed by hot phosphoric acid or anisotropic dry etching; a pair of sidewall dielectric spacers 312a are then formed over sidewalls of nearby planarized silicon dioxide layer 305a and on a portion of the patterned first conductive layer 302a in each of the plurality of gate regions (GR); the patterned first conductive layer 302a between the pair of sidewall dielectric spacers 312a is etched to form a shallow trench in each of the patterned first conductive layers 302a; and an ion-implantation is performed in a self-aligned manner to form an implant region 313a of the first conductivity type in a surface portion of the semiconductor substrate 300 between the pair of sidewall dielectric spacers 312a. The pair of sidewall dielectric spacers 312a are preferably made of silicon nitride as deposited by LPCVD and are formed by first depositing a silicon nitride layer 312 and then etching back a thickness of the deposited silicon nitride layer 312. The implant region 313a comprises a shallow implant region as indicated by a dash line for threshold-voltage adjustment and a deep implant region as indicated by cross symbols for forming a punch-through stop.

Figure 4B:
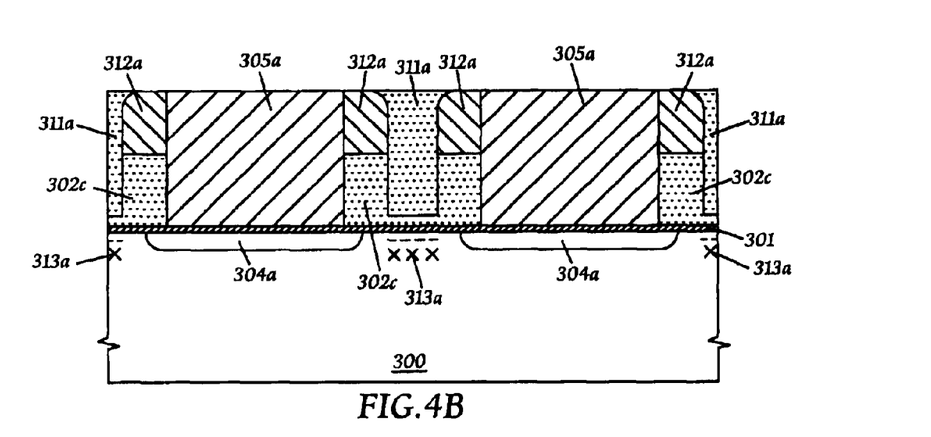

FIG. 4B shows a planarized conductive layer 311a is formed over a gap between the pair of sidewall dielectric spacers 312a in each of the plurality of gate regions (GR). The planarized conductive layer 311a is preferably made of doped polycrystalline silicon or doped amorphous silicon as deposited by LPCVD and is formed by first depositing a conductive layer 311 to fill a gap between the pair of sidewall dielectric spacers 312a and then planarizing the deposited conductive layer 311 using CMP with the pair of sidewall dielectric spacers 312a as a polishing stop.

Figure 4C:
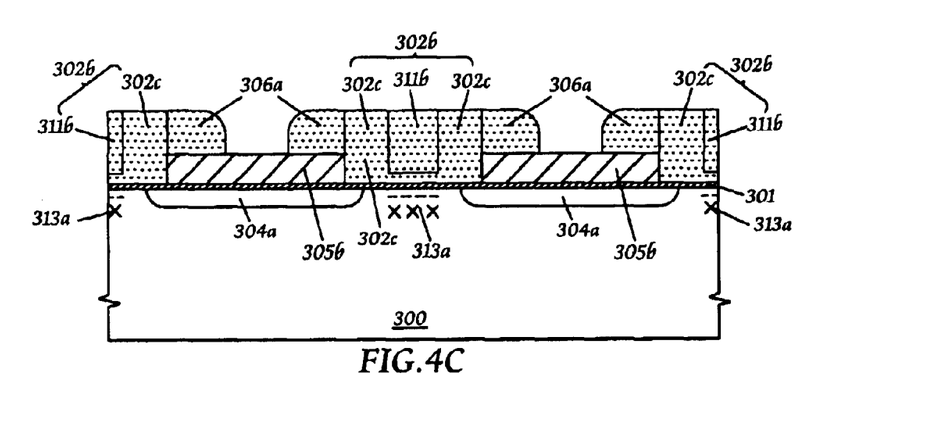
Figure 4D:
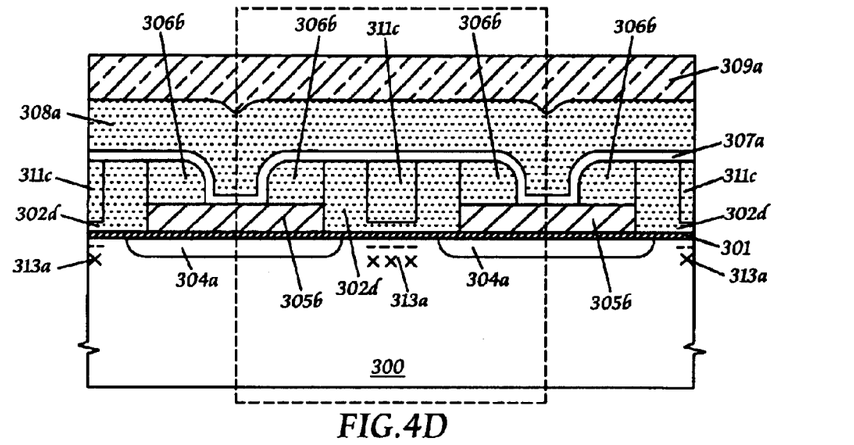

FIG. 4C shows that the planarized conductive layer 311a is etched back to a depth equal to a top surface level of the patterned first conductive layer 302a; the planarized silicon dioxide layer 305a in each of the common-source/drain regions (CS/DR) is etched back to have a thickness between 500 Angstroms and 1000 Angstroms; the pair of sidewall dielectric spacers 312a are then removed by hot phosphoric acid or anisotropic dry etching; and subsequently, a pair of sidewall conductive spacers 306a are formed over sidewalls of nearby patterned first conductive layers 302c and on a portion of the etched-back planarized silicon dioxide layer 305b in each of the common-source/drain regions (CS/DR). The pair of sidewall conductive spacers 306a are preferably made of doped polycrystalline silicon or doped amorphous silicon as deposited by LPCVD and are formed by first depositing a second conductive layer 306 and then etching back a thickness of the deposited second conductive layer 306. FIG. 4D shows that an intergate dielectric layer 307 is formed over a structure surface shown in FIG. 4C; a third conductive layer 308 is then formed over the intergate dielectric layer 307; a metal layer 309 is formed over the third conductive layer 308; and the metal layer 309, the third conductive layer 308, the pair of sidewall conductive spacers 306a, and the patterned first conductive layer 302c together with the etched-back planarized conductive layers 311b are simultaneously patterned and etched by a second masking photoresist (PRI) step (not shown) to form a plurality of word lines (WL's) 309a/308a as described in FIG. 2G. Similarly, a plurality of cell isolation regions 310a are formed in surface portions of the semiconductor substrate 300 outside of the plurality of word lines (WL's) 309a/308a and between the common-source/drain regions (CS/DR). A unit cell (UC) as marked by a dash square can be made to be equal to $4F^2$ if the width of the word line 309a/308a and the width of the cell isolation region 310a are defined to be a minimum feature size (F) of technology used. It is clearly seen that FIG. 4D is the same as FIG. 2G except that an implant region 313a is formed in a middle surface portion of the semiconductor substrate 300 under the major floating-gate 311c/302d to improve the punch-through effect of a scaled cell.

Figure 5A:
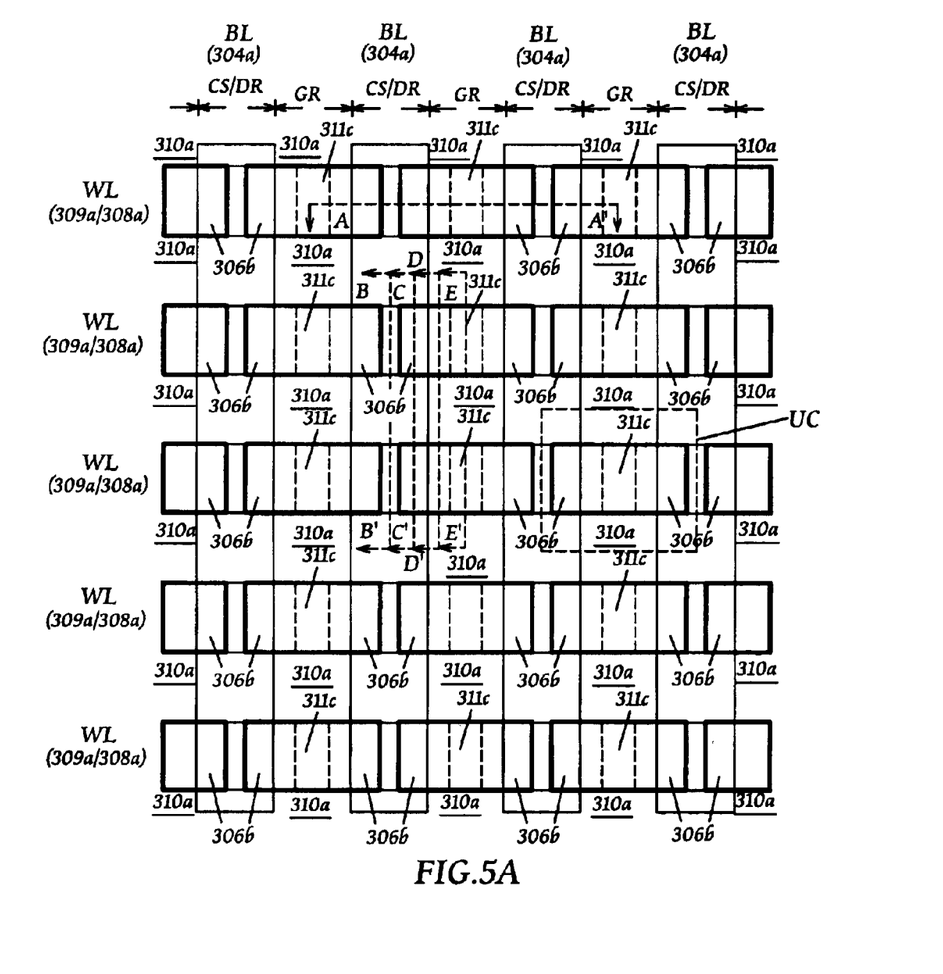
FIG. 5A shows a schematic top plan view.

Referring now to FIG. 5A, there is shown a schematic top plan view of the second-type contactless parallel common-source/drain diffusion bit-lines array of the present invention, in which a cross-sectional view along a A–A' line as indicated in FIG. 5A is shown in FIG. 4D. Comparing FIG. 5A to FIG. 3A, it is clearly seen that FIG. 5A is the same as FIG. 3A except that an implant region 313a is formed under each of the etched-back planarized conductive layers 311c as marked in FIG. 5A. Therefore, a further description for FIG. 5A is neglected.

Figure 5B:
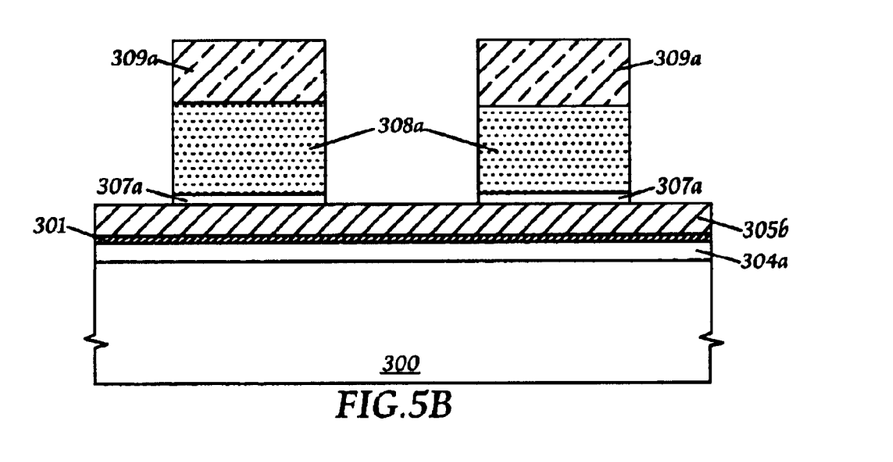
FIG. 5B shows a cross-sectional view along a B–B' line as indicated in FIG. 5A.

FIG. 5B shows a cross-sectional view along a B–B' line as indicated in FIG. 5A, which is the same as FIG. 3B. A further description of FIG. 5B can refer to that of FIG. 3B.

Figure 5C:
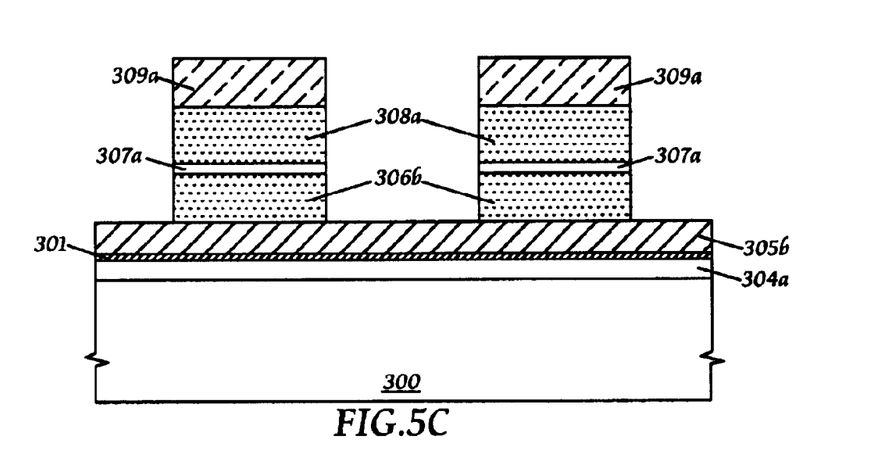
FIG. 5C shows a cross-sectional view along a C–C' line as indicated in FIG. 5A.

FIG. 5C shows a cross-sectional view along a C–C' line as indicated in FIG. 5A, which is also the same as FIG. 3C. Similarly, a further description of FIG. 5C can refer to that of FIG. 3C.

Figure 5D:
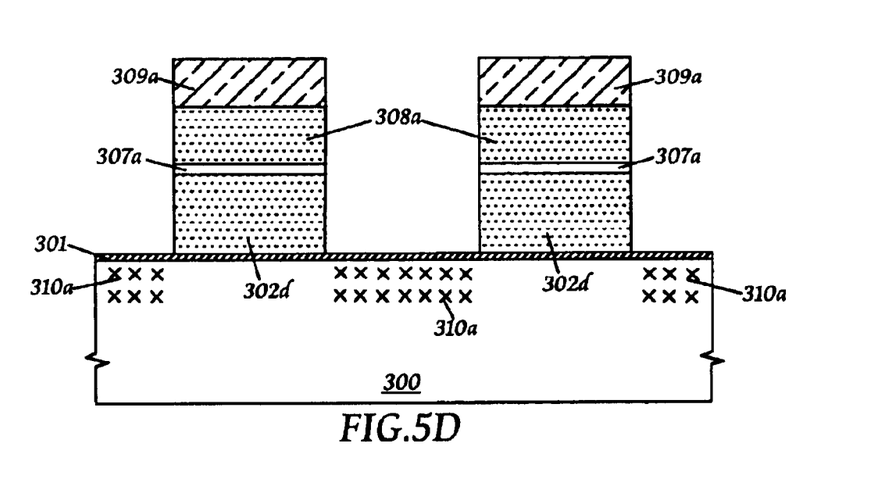
FIG. 5D shows a cross-sectional view along a D–D' line as indicated in FIG. 5A.

FIG. 5D shows a cross-sectional view along a D–D' line as indicated in FIG. 5A. It is clearly seen that FIG. 5D is the same as FIG. 3D and a further description of FIG. 5D can refer to that of FIG. 3D.

Figure 5E:
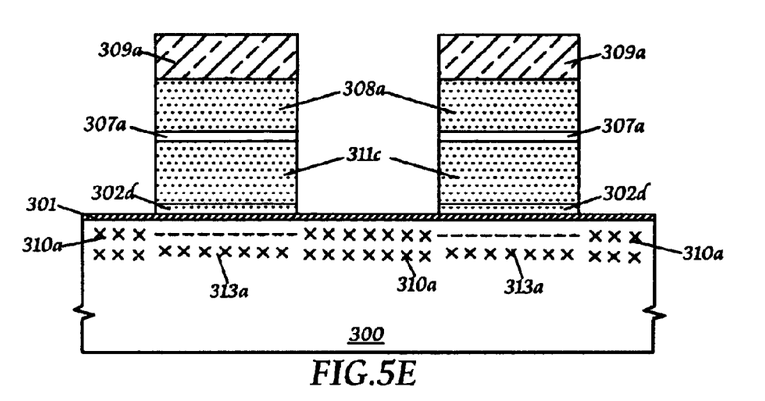
FIG. 5E shows a cross-sectional view along a E–E' line as indicated in FIG. 5A.

FIG. 5E shows a cross-sectional view along a E–E' line as indicated in FIG. 5A, in which a major floating-gate 302b in FIG. 3D is replaced by an etched-back planarized conductive island 311c being formed within the patterned first conductive island 302d in. FIG. SE and an implant region 313a as described is formed in a surface portion of the semiconductor substrate 300 under the etched-back planarized conductive island 311c. A further description of FIG. 5E can refer to that of FIG. 3D.

Figure 5F:
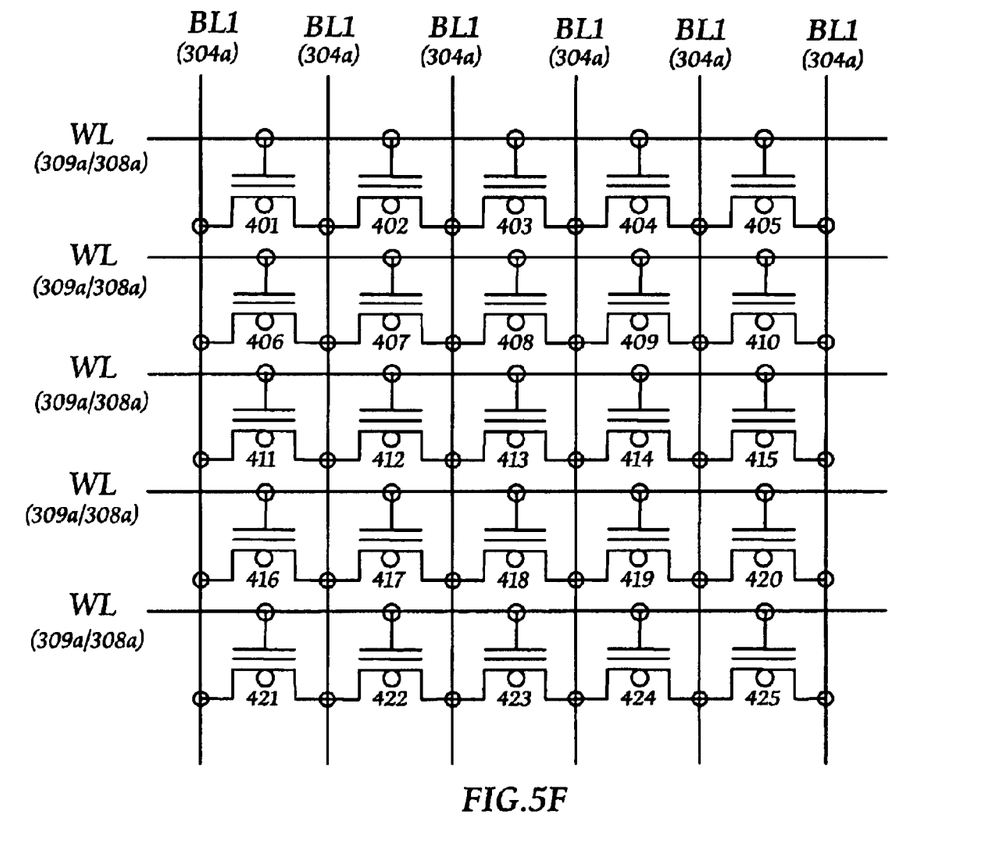
FIG. 5F shows a schematic circuit representation.

FIG. 5F shows a schematic circuit representation of the second-type contactless parallel common-source/drain diffusion bit-lines array of the present invention. It is clearly seen that FIG. 5F is the same as FIG. 3E except that a circle is marked under a middle portion of the major floating-gate for each of the second-type stack-gate flash cell structure to indicate an implant region 313a being formed to improve the punch-through effect of the scaled cell.

Accordingly, the features and advantages of the present invention as described above can be summarized as follows:

(a) The stack-gate flash cell structure of the present invention offers an integrated floating-gate to largely increase the coupling ratio without an additional masking photoresist step.

(b) The stack-gate flash cell structure of the present invention can offer a unit cell size of $4F^2$.

(c) The stack-gate flash cell structure of the present invention can offer an implant region in a middle portion of the semiconductor substrate under the major floating-gate to improve the punch-through effect of the scaled cell.

(d) The stack-gate flash cell structure and its contactless parallel common-source/drain diffusion bit-lines array of the present invention can be fabricated by using only two masking photoresist steps.

(e) The contactless parallel common-source/drain diffusion bit-lines array of the present invention offers a plurality of metal word lines to largely reduce the word-line resistance of a high-density flash memory array.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A stack-gate flash cell structure, comprising:

a semiconductor substrate of a first conductivity type;

a cell region comprising a gate region being formed over said semiconductor substrate, wherein said gate region being formed between a common-source region and a common-drain region is defined by a first masking photoresist step;

said common-source region comprising a common-source diffusion region being formed in a first surface portion of said semiconductor substrate, an etched-back planarized silicon dioxide layer over a first portion of a tunneling dielectric layer being formed over said common-source diffusion region, and a pair of extended floating-gate spacers being formed on side portions of said etched-back planarized silicon dioxide layer;

said common-drain region comprising a common-rain diffusion region being formed in a second surface portion of said semiconductor substrate, said etched-back planarized silicon dioxide layer over a second portion of said tunneling dielectric layer being formed over said common-drain diffusion region, and said pair of extended floating-gate spacers being formed on side portions of said etched-back planarized silicon dioxide layer;

said gate region comprising a major floating-gate being formed over a third portion of said tunneling dielectric layer, wherein said major floating-gate is integrated with nearby two extended floating-gate spacers to form an integrated floating-gate;

a word line on an intergate dielectric layer being formed over said integrated floating-gate and a portion of said etched-back planarized silicon dioxide layers between said pair of extended floating-gate spacers, wherein said word line, said intergate dielectric layer, and said integrated floating-gate are simultaneously patterned and etched by using a second masking photoresist step; and a cell isolation region being formed in each side surface portion of said semiconductor substrate outside of said word line and between said common-source region and said common-drain region.

2. The stack-gate flash cell structure according to claim 1, wherein said common-source diffusion region comprises a heavily-doped common-source diffusion region of a second conductivity type or a shallow heavily-doped common-source diffusion region of a second conductivity type being formed within a lightly-doped common-source diffusion region of said second conductivity type.

3. The stack-gate flash cell structure according to claim 1, wherein said common-drain diffusion region comprises a shallow heavily-doped common-drain diffusion region of a second conductivity type being formed within a lightly-doped common-source diffusion region of said second conductivity type or a heavily-doped common-drain diffusion region of a second conductivity type.

4. The stack-gate flash cell structure according to claim 1, wherein said common-drain diffusion region comprises a shallow heavily-doped common-drain diffusion region of a second conductivity type being formed within a moderately-doped common-drain diffusion region of said first conductivity type.

5. The stack-gate flash cell structure according to claim 1, wherein an implant region of said first conductivity type comprising a shallow implant region for threshold-voltage adjustment and a deep implant region for forming a punch-through stop is formed in a middle surface portion of said semiconductor substrate under said major floating-gate and is located between a pair of sidewall dielectric spacers being formed over sidewalls of said gate region and on a surface portion of said major floating-gate.

6. The stack-gate flash cell structure according to claim 1, wherein said cell isolation region comprises an isolation implant region of said first conductivity type or a shallow trench isolation region.

7. The stack-gate flash cell structure according to claim 1, wherein said word line comprises a metal layer over a barrier metal layer being formed over a doped polycrystalline silicon or doped amorphous silicon layer or a tungsten disilicide ($WSi_2$) layer being formed over a doped polycrystalline silicon or doped amorphous silicon layer.

8. A stack-gate flash cell structure, comprising:

a semiconductor substrate of a first conductivity type;

a cell region comprising a gate region being formed over said semiconductor substrate, wherein said gate region being formed between a common-source region and a common-drain region is defined by a first masking photoresist step;

said common-source region comprising a common-source diffusion region of a second conductivity type being formed in a first surface portion of said semiconductor substrate, an etched-back planarized silicon dioxide layer over a first portion of a tunneling dielectric layer being formed over said common-source diffusion region, a pair of extended floating-gate spacers being formed on side portions of said etched-back planarized silicon dioxide layer;

said common-drain region comprising a common-drain diffusion region being formed in a second surface portion of said semiconductor substrate, said etched-back planarized silicon dioxide layer over a second portion of said tunneling dielectric layer being formed over said common-drain diffusion region, and said pair of extended floating-gate spacers being formed on side portions of said etched-back planarized silicon dioxide layer;

said gate region comprising a major floating-gate being formed over a third portion of said tunneling dielectric layer, wherein said major floating-gate is integrated with nearby two extended floating-gate spacers to form an integrated floating-gate;

a word line on an intergate dielectric layer being formed over said integrated floating-gate and a portion of said etched-back planarized silicon dioxide layers between said pair of extended floating-gate spacers, wherein said word line, said intergate dielectric layer, and said integrated floating-gate are simultaneously patterned and etched by using a second masking photoresist step; and a cell isolation region being formed in each side surface portion of said semiconductor substrate outside of said word line and between said common-source region and said common-drain region.

9. The stack-gate flash cell structure according to claim 8, wherein said common-drain diffusion region comprises a heavily-doped common-drain diffusion region of said second conductivity type or a shallow heavily-doped common-drain diffusion region of said second conductivity type being formed within a lightly-doped common-drain diffusion region of said second conductivity type.

10. The stack-gate flash cell structure according to claim 8, wherein said common-drain diffusion region comprises, a heavily-doped common-drain diffusion region of said second conductivity type being formed within a moderately-doped common-drain diffusion region of said first conductivity type.

11. The stack-gate flash cell structure according to claim 8, wherein said word line comprises a metal layer over a barrier metal layer being formed over a doped polycrystalline silicon or doped amorphous silicon layer or a tungsten disilicide ($WSi_2$) layer being formed over a doped polycrystalline silicon or doped amorphous silicon layer.

12. The stack-gate flash cell structure according to claim 8, wherein an implant region of said first conductivity type comprising a shallow implant region for threshold-voltage adjustment and a deep implant region for forming a punch-through stop is formed in a middle surface portion of said semiconductor substrate under said major floating-gate and is located between a pair of sidewall dielectric spacers being formed over sidewalls of said gate region and on a portion of said major floating-gate.

13. A contactless flash memory array, comprising:

a semiconductor substrate of a first conductivity type;

a plurality of gate regions being alternately formed over said semiconductor substrate, wherein each of the plurality of gate regions being formed between a common-source region and a common-drain region is defined by a first masking photoresist step;

said common-source region comprising a common-source diffusion region being formed in a first surface portion of said semiconductor substrate to act as a common-source buried diffusion bit line, an etched-back planarized silicon dioxide layer over a first portion of a tunneling dielectric layer being formed over said common-source diffusion region, and a plurality of paired extended floating-gate spacers being formed on side portions of said etched-back planarized silicon dioxide layer;

said common-drain region comprising a common-drain diffusion region being formed in a second surface portion of said semiconductor substrate to act as a common-drain buried diffusion bit line, said etched-back planarized silicon dioxide layer over a second portion of said tunneling dielectric layer being formed over said common-drain diffusion region, and the plurality of paired extended floating-gate spacers being formed on side portions of said etched-back planarized silicon dioxide layer;

each of the plurality of gate regions comprising a plurality of major floating-gates being formed over a third portion of said tunneling dielectric layer, wherein each of the plurality of major floating-gates is integrated with nearby two extended floating-gate spacers to form an integrated floating-gate;

a plurality of word lines on a plurality of intergate dielectric layers being formed over a surface formed alternately by said integrated floating-gate and said etched-back planarized silicon dioxide layer between nearby integrated floating-gates, wherein the plurality of word lines, the plurality of intergate dielectric layers, and said integrated floating-gates are simultaneously patterned and etched by using a second masking photoresist step; and a plurality of cell isolation regions being formed in surface portions of said semiconductor substrate outside of the plurality of word lines and between said common-source region and said common-drain region.

14. The contactless flash memory array according to claim 13, wherein said common-source diffusion region comprises a heavily-doped common-source diffusion region of a second conductivity type or a shallow heavily doped common-source diffusion region of a second conductivity type being formed within a lightly-doped common-source diffusion region of said second conductivity type.

15. The contactless flash memory array according to claim 13, wherein said common-drain diffusion region comprises a heavily-doped common-drain diffusion region of a second conductivity type or a shallow heavily-doped common-drain diffusion region of a second conductivity type being formed within a lightly-doped common-drain diffusion region of said second conductivity type.

16. The contactless flash memory array according to claim 13, wherein said common-drain diffusion region comprises a shallow heavily-doped common-drain diffusion region of a second conductivity type being formed within a moderately-doped common-drain diffusion region of said first conductivity type.

17. The contactless flash memory array according to claim 13, wherein each of the plurality of cell isolation regions comprises an isolation implant region of said first conductivity type or a shallow trench isolation region.

18. The contactless flash memory array according to claim 13, wherein each of the plurality of word lines comprises a metal layer over a barrier metal layer being formed over a doped polycrystalline silicon or doped amorphous silicon layer or a tungsten disilicide ($WSi_2$) layer being formed over a doped polycrystalline silicon or doped amorphous silicon layer.

19. The contactless flash memory array according to claim 13, wherein an implant region of said first conductivity type comprising a shallow implant region for threshold-voltage adjustment and a deep implant region for forming a punch-through stop is formed in a middle surface portion of said semiconductor substrate under each of the plurality of major floating-gates.

20. The contactless flash memory array according to claim 13, wherein each of the plurality of intergate dielectric layers comprises an oxide-nitride oxide (ONO) layer and said tunneling dielectric layer comprises a thermal-oxide layer or a nitrided thermal-oxide layer.

* * * * *